US005567958A

United States Patent [19]
Orlowski et al.

[11] Patent Number: 5,567,958
[45] Date of Patent: Oct. 22, 1996

[54] HIGH-PERFORMANCE THIN-FILM TRANSISTOR AND SRAM MEMORY CELL

[75] Inventors: Marius Orlowski; James D. Hayden; Bich-Yen Nguyen, all of Austin, Tex.

[73] Assignee: Motorola, Inc., Schaumburg, Ill.

[21] Appl. No.: 452,944

[22] Filed: May 31, 1995

[51] Int. Cl.$^6$ .................................................. H01L 29/78
[52] U.S. Cl. .......................... 257/66; 257/903; 257/622; 257/330; 257/350
[58] Field of Search ................................ 257/66, 67, 347, 257/622, 387, 330, 332, 903, 350

[56] References Cited

U.S. PATENT DOCUMENTS

| | | | |
|---|---|---|---|
| 4,845,537 | 7/1989 | Nishimura et al. | 257/302 |
| 4,864,374 | 9/1989 | Banerjee | 257/68 |
| 5,124,768 | 6/1992 | Mano et al. | 257/347 |
| 5,208,476 | 5/1993 | Inoue | 257/66 |
| 5,404,030 | 4/1995 | Kim et al. | 257/903 |
| 5,407,846 | 4/1995 | Chan | 437/41 |

FOREIGN PATENT DOCUMENTS

| | | | |
|---|---|---|---|
| 0064971 | 3/1991 | Japan | 257/350 |
| 0007877 | 1/1992 | Japan | 257/347 |
| 0235358 | 9/1993 | Japan | 257/350 |
| 0209109 | 7/1994 | Japan | 257/347 |

OTHER PUBLICATIONS

H. Kuriyama et al., "An Asymmetric Memory Cell using a C–TFT for ULSI SRAMs", 1992 Symposium on VLSI Technology Digest of Tech.Papers, pp. 38–39.

*Primary Examiner*—Robert P. Limanek
*Assistant Examiner*—David B. Hardy
*Attorney, Agent, or Firm*—Jasper W. Dockrey

[57] ABSTRACT

A thin-film transistor and SRAM memory cell include thin-film source and drain regions (12, 14) separated by an opening (22) and overlying and insulating layer (11). A thin-film channel layer (16) overlies the thin-film source and drain regions (12, 14) and a portion of the insulating layer (11) exposed by the opening (22). A thin-film gate electrode (20) is positioned in the opening (22) and defines a thin-film channel region (24) in the thin-film channel layer (16). The thin-film gate electrode (20) is separated from the thin-film channel region (24) by a gate dielectric layer (18). The thin-film channel region (24) extends along vertical wall surfaces (26, 28) of the thin-film source and drain regions (12, 14) providing an extended channel length for the thin-film transistor.

12 Claims, 4 Drawing Sheets

HIGH-PERFORMANCE THIN-FILM TRANSISTOR AND SRAM MEMORY CELL

FIELD OF THE INVENTION

This invention relates, in general, to a semiconductor device, and more particularly, to a thin-film transistor and to an SRAM memory cell incorporating the thin-film transistor.

BACKGROUND OF THE INVENTION

In the field of integrated circuit fabrication technology, there is a continuing need to design circuit components having a high packing density. To achieve high packing density, circuit components are typically Fabricated in vertically distributed layers of material. For example, the need to fabricate circuits having a high packing density has lead to wide-spread use of multi-layered electrical interconnects. Furthermore, advances in thin-film technology have enabled designers to fabricate MOS transistors in thin-film layers overlying active substrate devices. For example, thin-film load transistors are commonly used in SRAM memory cells in order to increase the packing density, and to provide increased integration levels in memory devices, microprocessors, microcontrollers, and the like.

Although thin-film transistors provide a means of increasing the packing density of an integrated circuit, when the transistor channel length is fabricated below one micron, erratic variation in operating performance is observed. The non-uniformity of operating performance from one transistor to the next is, in part, related to the physical characteristics of the materials used in fabrication. Thin-film transistors are typically formed in polycrystalline silicon. Polycrystalline silicon is a granular material having a grain size distribution ranging from about 0.1 to 1.0 micron. The grains within the polycrystalline silicon can function as trapping sites for impurities. The impurities cause localized changes in the electrical characteristics of polycrystalline silicon.

A localized high population of trapping sites in the channel region of a thin-film transistor can lead to erratic transistor performance. For example, when the gate length of a thin-film transistor approaches the size of the grains found in polycrystalline silicon, variations in the on and off current of a thin-film transistor are observed. Additionally, the variance in electrical conductivity causes a random variation in the threshold voltage of thin-film transistors fabricated to the same nominal gate dimensions.

To further compound the problem of grain-induced variance in electrical conductivity, uncontrolled dopant diffusion along the grain boundaries of polycrystalline silicon also occurs. The diffusion of dopants preferentially takes place along the grain boundaries of the polycrystalline silicon. When the gate length of a thin-film transistor is substantially the same as the size of the polycrystalline grains, uncontrolled diffusion of dopants within the channel region causes a further variance in electrical conductivity. Foe example, the lateral diffusion of dopants into the channel region of a thin-film transistor increases the current leakage through the transistor when the transistor is in the off-state.

One solution to nonuniform electrical conductivity in thin-film transistors having a gate length in the sub-micron range, is to form the thin-film transistor in a very thin layer of polycrystalline silicon. By reducing the thickness of the polycrystalline silicon, less variation in grain size distribution can be expected. However, while the fabrication of the channel region in a polycrystalline silicon layer having a thickness of less than 500 angstroms, improves the on and off current performance, the reduced thickness also increases the series resistance of the transistor. Although greater uniformity in performance is attained, the overall performance level in the thin-film transistors is reduced. Accordingly, further development in the design of thin-film transistors is necessary to fully realize the potential advantage of high packing densities possible with their incorporation into integrated circuit devices.

SUMMARY OF THE INVENTION

In practicing the present invention there is provided a high-performance thin-film transistor having an extended channel region. The thin-film transistor obtains performance benefits of an extended channel region while not requiring a corresponding increase in the amount of substrate surface for its fabrication. The thin-film transistor of the invention can be advantageously incorporated into an SRAM memory cell to provide a compact cell design having improved performance characteristics. In one embodiment of the invention, a first thin-film layer overlies an insulating layer. The first thin-film layer has a first section containing a first wall surface, and a second section containing a second wall surface. A void separates the first wall surface from the second wall surface and also exposes a portion of the insulating layer. A second thin-film layer overlies the first and second wall surfaces and the exposed portion of the insulating layer. A gate dielectric layer overlies the second thin-film layer. A gate electrode is positioned in the void and defines a channel region in the second thin-film layer. The channel region extends along the first and second wall surfaces and overlies the exposed portion of the insulating layer.

Figure 1:
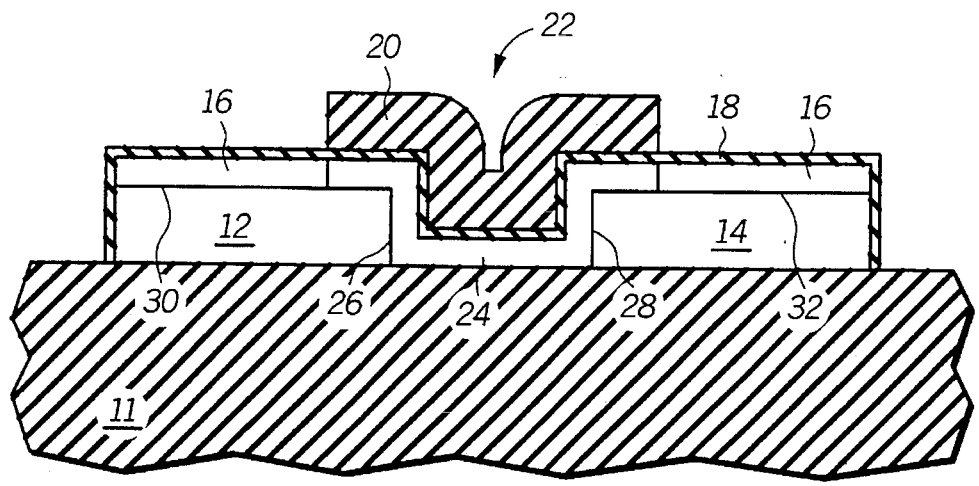
FIG. 1 illustrates, in cross-section, a thin-film transistor formed in accordance with a first embodiment of the invention.

It will be appreciated that for simplicity and clarity of illustration, elements shown in the figures have not necessarily been drawn to scale. For example, the dimensions of some of the elements are exaggerated relative to each other for clarity. Further, where considered appropriate, reference numerals have been repeated among the figures to indicate corresponding elements.

DETAILED DESCRIPTION OF PREFERRED EMBODIMENTS

The present invention is for a thin-film transistor, and for an SRAM memory cell incorporating the thin-film transistor. The thin-film transistor of the present invention offers superior performance by increasing the channel length of the thin-film transistor, while avoiding a corresponding increase in the surface area of an SRAM memory cell. The extensive channel length of the thin-film transistor reduces current leakage in the thin-film transistor when the transistor is shut off. Additionally, the channel length provided by the thin-film transistor of the invention reduces transistor performance degradation arising from short-channel characteristics typically encountered in sub-micron, thin-film devices. Furthermore, the thin-film transistor of the invention provides a thin-film transistor having improved on and off current.

The novel construction of the thin-film transistor provides a channel region separate from the source and drain regions of the transistor. Improved on and off current performance is achieved by providing a separate thin channel layer in the device. Also, by providing a separate channel layer, degradation in the current conducting capability of power supply lines to an SRAM cell incorporating the thin-film transistor is avoided. These and other advantages of the present invention will be readily apparent following a description of the thin-film transistor of the invention and an exemplary embodiment an SRAM memory cell incorporating the thin-film transistor.

FIG. 1 illustrates, in cross-section, one embodiment of a thin-film transistor arranged in accordance with the invention. The thin-film transistor overlies an insulating layer 11. The thin-film transistor includes source and drain regions 12 and 14 overlying insulating layer 11, and a thin-film channel layer 16 overlying the source and drain regions. As will be subsequently described, thin-film source and drain regions 12 and 14 and thin-film channel layer 16 are formed by depositing separate thin-film layers onto insulating layer 11.

Preferably, the source and drain regions 12 and 14 are a semiconductor material doped with a conductivity determining dopant species to have a low electrical resistivity. Preferably, the semiconductor material is polycrystalline silicon. Alternatively, the thin-film layer can be another material such as a refractory-metal silicide, and the like. Thin-film channel layer 16 overlies thin-film source and drain regions 12 and 14, and a portion of insulating layer 11 intermediate to thin-film source and drain regions 12 and 14. Preferably, thin-film channel layer 16 is an amorphous silicon layer chemical vapor deposited to a predetermined thickness. The amorphous silicon can be either undoped, or lightly doped depending upon the particular electrical conductive characteristics desired in the thin-film transistor. Preferably, the amorphous silicon is an undoped silicon layer.

A gate dielectric layer 18 overlies thin-film channel layer 16 and separates thin-film channel layer 16 from a gate electrode 20. Gate electrode 20 resides in an opening 22 between thin-film source drain regions 12 and 14 and defines a thin-film channel region 24 within thin-film channel layer 16. As illustrated in FIG. 1, thin-film channel region 24 is coextensive with gate electrode 20. Thin-film channel region 24 overlies a portion of insulating layer 11 and extends along vertical wall surfaces 26 and 28 of thin-film source and drain regions 12 and 14, respectively. Thin-film channel region 24 also overlies a portion of the upper surface 30 and 32 of thin-film source and drain regions 12 and 14, respectively.

By forming thin-film channel layer 24 in a separate thin-film layer in opening 22, the lateral extent of thin-film channel region 24 can be increased, while not increasing the lateral surface area of the thin-film transistor. The increased lateral extent of thin-film channel region 24 is less susceptible to dopant diffusion thereby reducing the off-leakage of the thin-film transistor. This is important where the thin-film transistor is incorporated as a load device in an SRAM memory cell. Further, by fabricating the thin-film source and drain regions in a separate thin-film layer, short channel effects arising from an abrupt change in doping concentration below the gate electrode are minimized. Moreover, the diffusion of dopant species in the thin-film source and drain regions is also restricted thereby further avoiding a performance degradation arising from short-channel effects.

It is also important to note that the construction of the thin-film transistor of the invention provides a self-aligned source and drain regions to the gate electrode by forming gate electrode 20 in opening 22, the channel region and source and drain regions operative in the thin-film transistor are defined by a single deposition and etching step.

Figure 2:
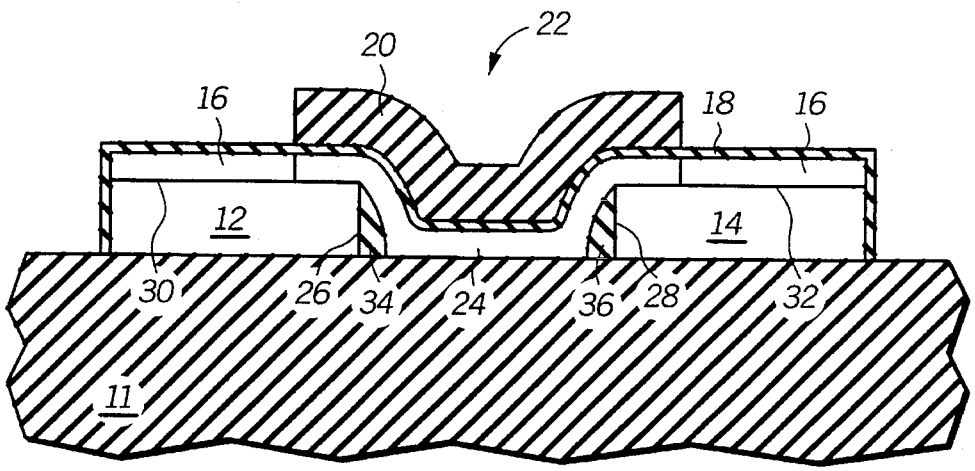
FIG.2 illustrates, in cross-section, a thin-film transistor formed in accordance with a second embodiment of the invention.

A second embodiment of the thin-film transistor of the invention is illustrated in FIG. 2. In the second embodiment, insulating sidewall spacers 34 and 36 are provided adjacent to vertical wall surfaces 26 and 28, respectively. Insulating sidewall spacers 34 and 36 function to further offset a portion of thin-film channel region 24 from thin-film source and drain regions 12 and 14. By offsetting the thin-film source and drain regions from the thin-film channel region, improved performance of the thin-film transistor is possible. The offset spaces the junction away from the edge of the gate electrode keeping the off-current of the thin-film transistor at a low value. Accordingly, by fabricating thin-film channel region 24 to have an extended lateral extent and coupled with the junction offset provided by insulating sidewall spacers 34 and 36, a thin-film transistor is provided having substantially reduced off-current levels.

Figure 3:
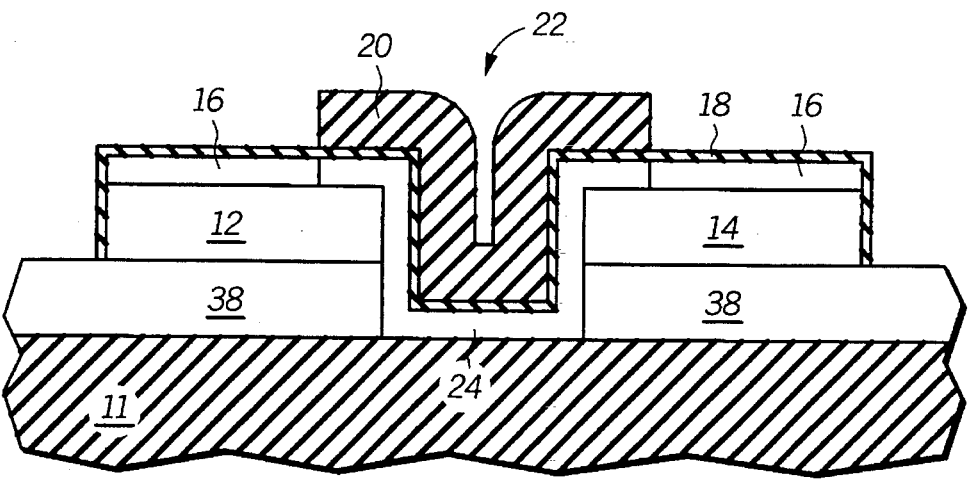
FIG. 3 illustrates, in cross-section, a thin-film transistor in accordance with a third embodiment of the invention.

Shown in FIG. 3 is a third embodiment of the thin-film transistor of the invention. The third embodiment illustrates an arrangement for further increasing the lateral extent of thin-film channel region 24. To obtain the extended channel length, opening 22 extends into a second insulating layer 38. Second insulating layer 38 is formed by the deposition of an insulating material that is differentially etchable with respect to insulating layer 11. At the time that opening 22 is formed, the thin-film layer containing source and drain regions 12 and 14 is etched to define the extent of opening 22. Then, the etching chemistry is changed and second insulating layer 38 is subsequently etched. Because second insulating layer 38 is differentially etchable with respect to insulating layer 11, the etching stops upon exposure of insulating layer 11. In one method, insulating layer 11 is formed by the deposition of silicon dioxide, and second insulating layer 38 is formed by the deposition of a layer of silicon nitride.

Those skilled in the art will recognize that other combinations of insulating material can also be used, and that the invention is not limited to the aforementioned combination of insulating materials. Furthermore, although the formation of a second insulating layer improves the ease of fabrication of the third embodiment of the thin-film transistor, those skilled in the art will recognize that the formation of a second insulating layer differentially etchable with respect to insulating layer 11 is not essential. Opening 22 can simply be etched into insulating layer 11 after defining source and drain regions 12 and 14. The etching of insulating layer 11 directly advantageously simplifies the fabrication process of a thin-film transistor formed in accordance with the third embodiment.

Figure 4:
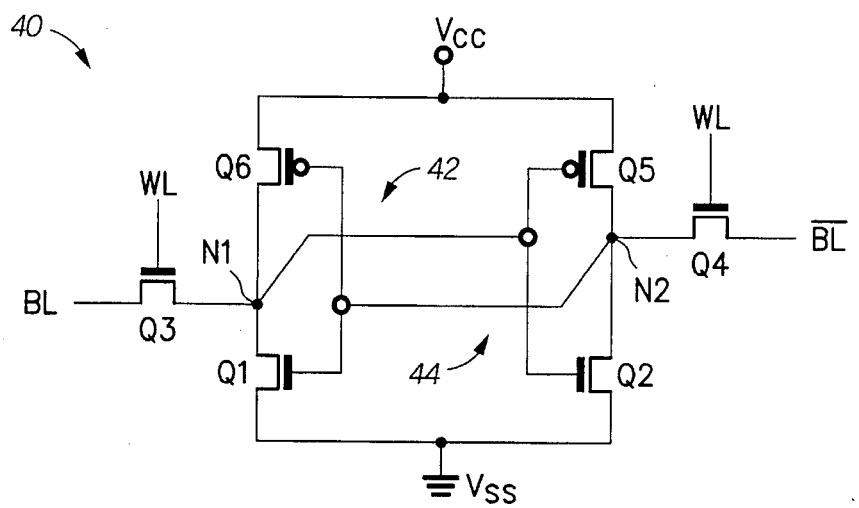
FIG. 4 is a schematic circuit diagram of an SRAM memory cell incorporating the thin-film transistor of the invention.

The advantages of the thin-film transistor of the present invention can be readily appreciated through the description of one embodiment of an SRAM memory cell incorporating the thin-film transistor. A schematic diagram of an SRAM memory cell 40 is illustrated in FIG. 4. SRAM memory cell 40 includes two cross-coupled inverters 42 and 44. Inverter 42 includes thin-film load transistor Q6 coupled to driver transistor Q1. Correspondingly, inverter 44 includes thin-film load transistor Q5 coupled to driver transistor Q2. Bit line access to inverter 42 is provided by pass transistor Q3. Correspondingly, bit line access to inverter 44 is provided by pass transistor Q4. Pass transistors Q3 and Q4 are controlled by a split word line designated WL. Supply voltage is provided by a Vcc input running to the source regions of thin-film load transistors Q5 and Q6. A ground signal $V_{ss}$ is coupled to the source regions of driver transistors Q1 and Q2. As will be subsequently described, a compact SRAM cell arrangement can be achieved through the incorporation of a thin-film transistor of the invention as transistors Q5 and Q6 in the SRAM memory cell.

In accordance with the invention, fabrication steps for the formation of an SRAM memory cell, are illustrated in FIGS. 5–10. Those skilled in the art will appreciate that although a specific configuration of the SRAM cell is illustrated, other configurations are possible and can fully achieve the advantages of the present invention.

Figure 5:
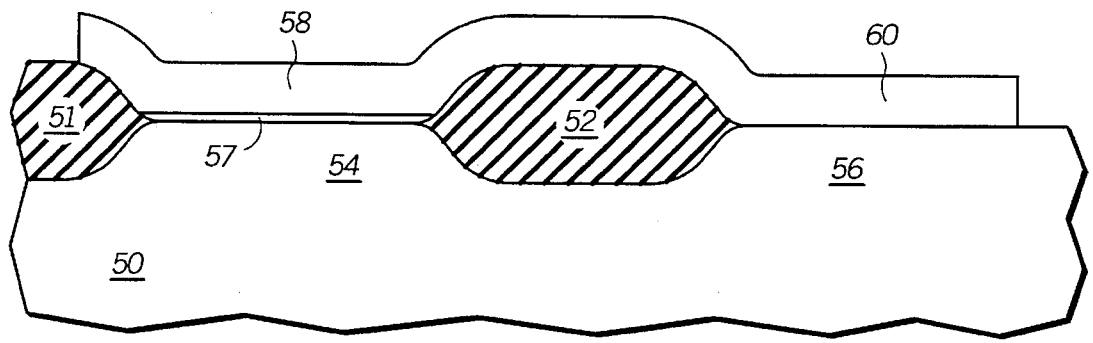
FIGS. 5–6 illustrate processing steps for fabricating an SRAM memory cell of the invention.

Illustrated in FIG. 5, in cross-section, is a portion of a semiconductor substrate 50 having already undergone several steps in accordance with the invention. Field oxide regions 51 and 52 reside at the surface of semiconductor substrate 50 and define a first active region 54 and a second active region 56. A gate dielectric layer 57 overlies first active region 54. A polycrystalline silicon layer is chemical vapor deposited, then patterned and etched to form a driver gate electrode 58 overlying gate dielectric layer 57 at first active region 54. The polycrystalline silicon layer extends over field oxide region 52 and forms a contact extension 60 overlying second active region 56. The polycrystalline silicon is doped with an N-type dopant either during deposition, or immediately afterwards.

Figure 6:
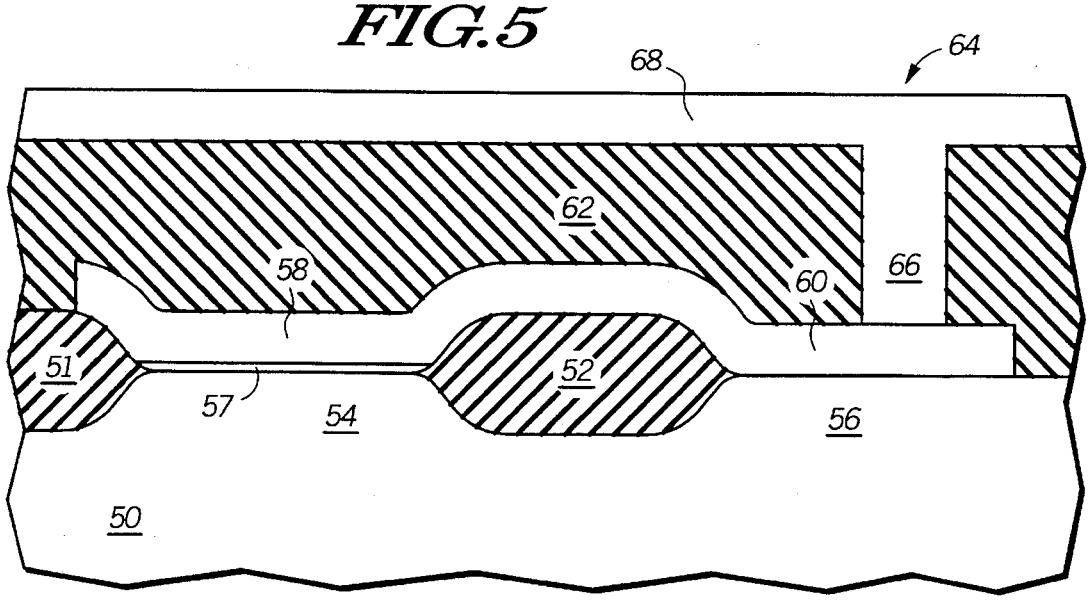

After defining driver gate electrode 58 and contact extension 60, a thick interlevel dielectric layer (ILD) 62 is deposited to overlie substrate 50, as illustrated in FIG. 6. Preferably, interlevel dielectric layer 62 is formed by the chemical vapor deposition of silicon dioxide using tetraethylorthosilane (TEOS) source gas. Alternatively, interlevel dielectric layer 62 can be a spin-on glass material, or a doped silicate glass, or the like. After deposition, an opening 64 is formed in ILD layer 62. Opening 64 is preferably formed by placing a photolithographic pattern on ILD layer 62, and anisotropically etching ILD layer 62 using a selective etching gas. The selective etching gas preferentially etches ILD layer 62 and does not substantially etch conductive materials, such as polycrystalline silicon. Upon completion of the etching process opening 62 exposes a surface portion of contact extension 60.

After forming opening 64, a metallized contact 66 is formed in opening 64. The metallized contact is formed by filling opening 64 with a material capable of forming an ohmic contact between thin-film layers containing dopants of opposite conductivity type. For example, opening 64 can be filled with a refractory metal, such as tungsten, followed by chemical-mechanical-polishing to form a smooth, planar surface on ILD layer 62. Alternatively, a refractory metal silicide material, such as tungsten silicide, can be deposited and planarized to fill opening 64.

Once the formation of metallized contact 66 is complete, a second thin-film layer 68 is deposited to overlie interlevel dielectric layer 62. Preferably, second thin-film layer 68 is formed by the chemical vapor deposition of polycrystalline silicon to a thickness of about 1,000 to 1,500 angstroms. During the chemical vapor deposition, boron dopant is introduced such that second thin-film layer 68 exhibits a P-type conductivity. Alternatively, second thin-film layer 68 can be deposited as an undoped polycrystalline silicon material and ion implanting boron atoms into the polycrystalline silicon.

Metallized contact 66 electrically couples second thin-film layer 68 to contact extension 60. Because metallized contact 66 is formed from a refractory metal or a refractory metal silicide material, the formation of a diode is avoided and an ohmic contact exists between the P-type material of second thin-film layer 68 and the N-type material of contact extension 60.

Figure 7:
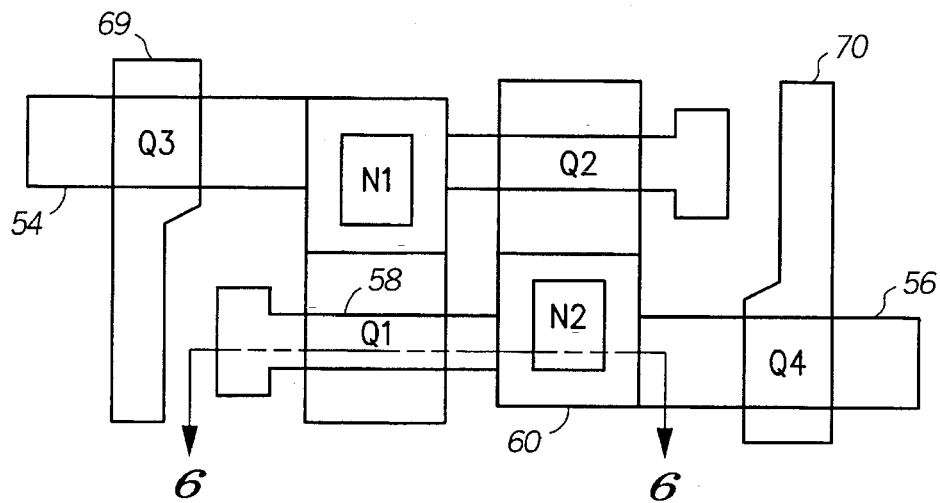
FIG. 7 is a plain view of the first level of the SRAM memory cell of the invention.

A plain view of the first level of the SRAM memory cell under construction is illustrated in FIG. 7. The locations of driver transistors Q1 and Q2 are illustrated in addition to the locations of pass transistors Q3 and Q4. Referring to FIGS. 4, 6 and 7, metallized contact 66 forms node N2. FIG. 6 is a cross-sectional view of a portion of the SRAM memory cell taken along section line 6—6 in FIG. 7. Driver gate electrode 58 forms the gate electrode of transistor Q1. Patterned thin-film layers 69 and 70 are disposed on the surface of substrate 50 and function as a split word line for the SRAM memory cell. Thin-film layer 69 and 70 form gate electrodes of pass transistors Q3 and Q4, respectively.

Those skilled in the art will recognize that the geometric configurations of the active regions and the gate electrodes for the driver transistors and the pass transistors combine to form a compact SRAM memory cell. The novel arrangement for the thin-film load transistors to be subsequently formed in the SRAM memory cell are arranged such that the compact cell design is maintained throughout the fabrication process.

Figure 8:
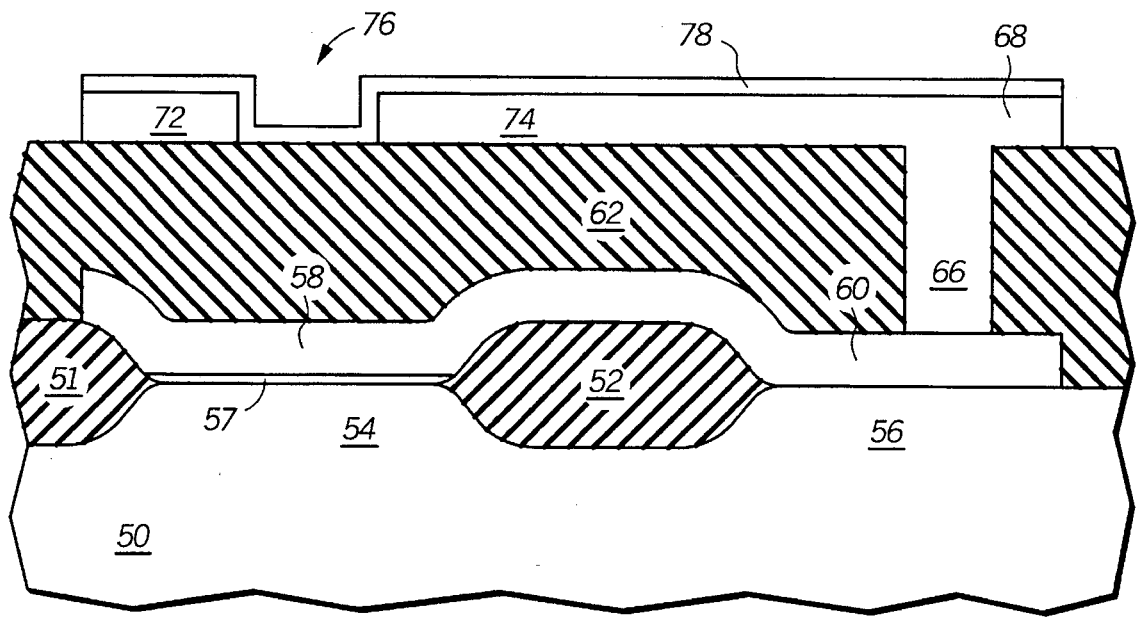
FIGS. 8–9 illustrate, in cross-section, processing steps for the fabrication of the second level of the SRAM memory cell of the invention.

The fabrication of the second level of the SRAM memory cell begins with the formation of thin-film source and drain regions 72 and 74, as illustrated in FIG. 8. Thin-film source and drain regions 72 and 74 are formed by dividing second thin-film layer 68 into two sections. Two sections are created by forming an opening 76 in second thin-film layer 68. Preferably, opening 76 is formed by placing a photolithographic pattern on second thin-film layer 68 and etching the thin-film layer. Preferably, a reactive ion etching process is used to anisotropically etch thin-film layer 68. The etching process forms substantially vertical sidewalls in second thin-film layer 68.

After forming opening 76, a thin-film channel layer 78 is deposited to overlie thin-film source and drain regions 72 and 74. Preferably, thin-film channel layer 78 is formed by the deposition of 100 to 600 angstroms of undoped, amorphous silicon. It is important to note that this process is completely separate from the formation of thin-film source and drain regions 72 and 74. Accordingly, thin-film channel region can have physical properties substantially different from those of the thin-film source and drain regions.

Figure 9:
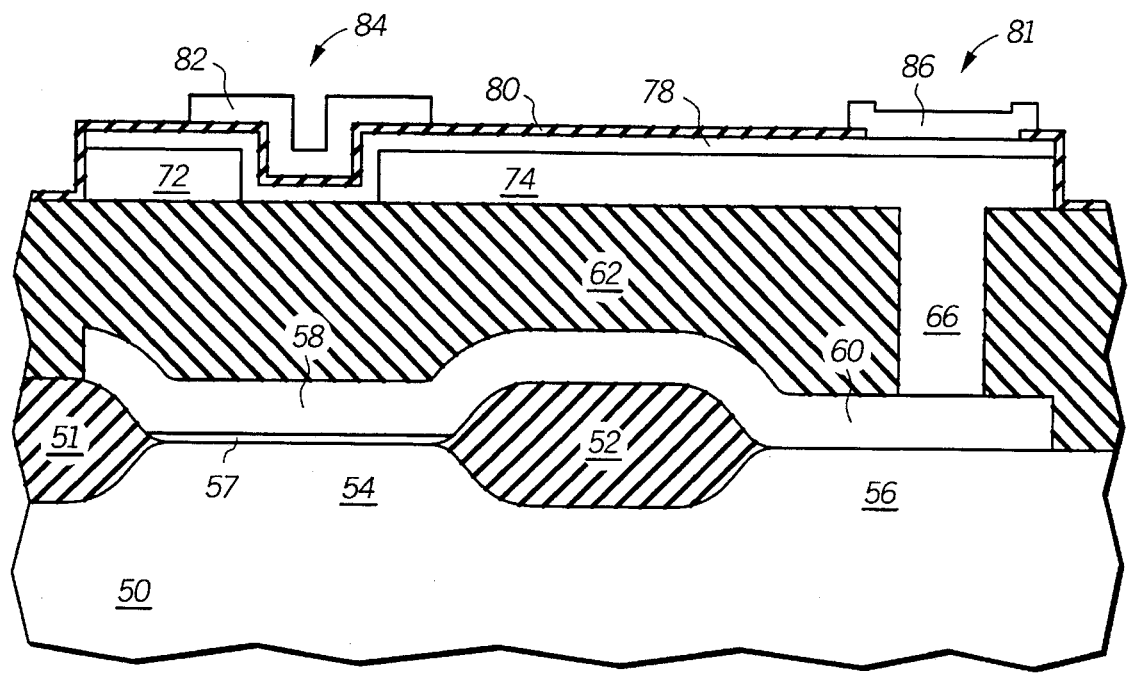

Once thin-film channel layer 78 has been deposited, the formation of a thin-film load transistor is completed following the steps previously described for the thin-film transistor of the invention. As illustrated in FIG. 9, a gate dielectric layer 80 is deposited to overlie thin-film channel layer 78. Preferably, gate dielectric layer 80 is silicon dioxide having a thickness of about 70 to 300 angstroms. Gate dielectric layer 80 can be formed by chemical vapor deposition, or alternatively, by the thermal oxidation of thin-film channel layer 78.

After forming gate dielectric layer 80, and opening 81 is formed therein to expose a portion of thin-film channel layer 78. Then, a thin-film gate electrode 82 and gate extension 86 are formed. Thin-film gate electrode 82 overlies gate dielectric layer 80 and is positioned in opening 76. Gate extension 86 makes contact to channel region 78 though opening 81. Preferably, thin-film gate electrode 82 and gate extension 86 are formed by the deposition and etching of about 1,000 angstroms of boron-doped polycrystalline silicon. Alternatively, the gate electrode and gate extension can be formed by the deposition of an undoped layer of polycrystalline silicon followed by the ion implantation of boron atoms and etching an process.

Thin-film gate electrode 82, thin-film channel layer 78, and thin-film source and drain regions 72 and 74 form the active elements of a thin-film load transistor 84. The drain region of thin-film load transistor 84 is electrically coupled to driver gate electrode 58 through metallized contact 66 and contact extension 60.

Figure 10:
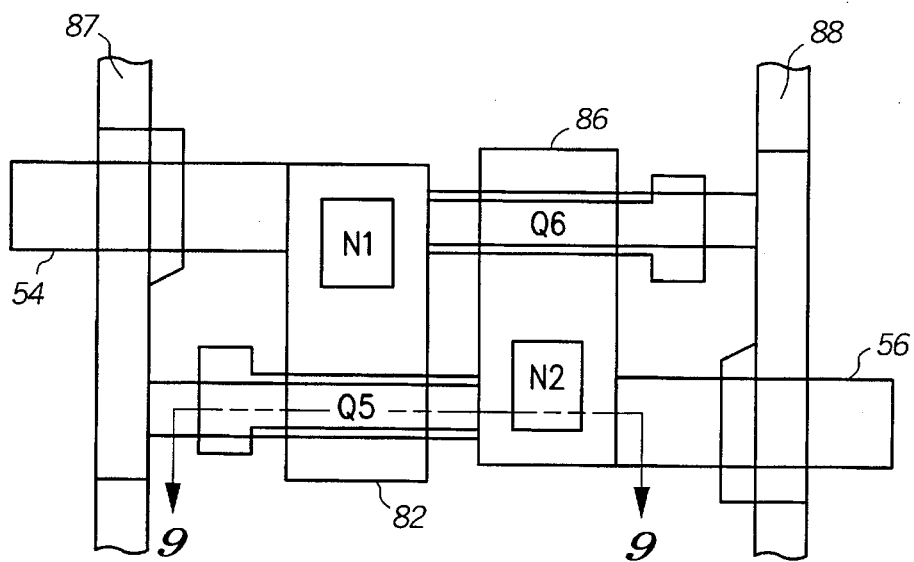
FIG. 10 is a plain view of the second level of the SRAM memory cell of the invention.

The compact layout of an SRAM memory cell formed in accordance with the invention, is illustrated in FIG. 10. The structure shown in FIG. 9 is a cross-sectional view of the memory cell taken along section line 9—9 of FIG. 10. The location of thin-film load transistor 84, shown in FIG. 9, is designated Q5 in FIGS. 4 and 10. Thin-film gate electrode 82 is coupled to driver transistor Q2 (shown in FIGS. 4 and 7) through node N1. Also, thin-film gate extension 86 electrically couples the thin-film gate electrode of transistor Q6 to the drain region of driver transistor Q2 through metallized contact 66 and gate extension 60.

At the time of forming second thin-film layer 68, Vcc supply lines 87 and 88 can also be formed. As can be understood by comparing FIGS. 7 and 10, Vcc supply lines 87 and 88 are aligned with split word lines 69 and 70. Vcc supply lines 87 and 88 are vertically separated from split word line 69 and 70 by ILD layer 62.

It is important to note that the novel arrangement of the SRAM memory cell of the invention permits the Vcc supply lines to be formed by the same layer of polycrystalline silicon in which thin-film source and drain regions 72 and 74 are also formed. The use of a common layer of polycrystalline silicon for both the Vcc supply lines and for the thin-film source and drain regions of the thin-film load transistors reduces the complexity of the fabrication process and avoids unnecessary multiple conductive layers for the fabrication of an SRAM memory cell. Furthermore, the thickness of the Vcc supply lines does not need to be restricted to accommodate the need for a thin-film channel region having a limited vertical thickness. The novel arrangement of a separate channel layer in the thin-film load transistors removes any constraint on the film thicknesses of the Vcc supply lines and the thin-film source and drain regions.

Those skilled in the art will appreciate that the incorporation of the thin-film transistor of the invention into the SRAM memory cell of the invention provides a compact cell architecture. Furthermore, the performance advantages previously described for the thin-film transistor of the invention combine with the compact architecture to provide an SRAM memory cell having superior performance characteristics. For example, improved data retention in the SRAM memory cell of the invention is attained by the reduced current leakage from the thin-film load transistors.

In addition to the illustrated fabrication process for the SRAM memory cell illustrated in FIG. 10, the other embodiments of the thin-film transistor of the invention illustrated in FIGS. 2 and 3 can be incorporated into the SRAM memory cell. The benefits of the other embodiments of the thin-film transistor of the invention can be fully realized by their incorporation into the SRAM memory cell shown in FIG. 10.

Thus it is apparent that there has been provided, in accordance with the invention, a high-performance thin-film transistor and SRAM memory cell, which fully meet the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, the thin-film transistor of the invention can be used in semiconductor devices other than memory devices, such as logic devices, and the like. It is therefore intended to include within the invention all such variations and modifications as fall within the scope of the appended claims and equivalents thereof.

We claim:

1. A semiconductor device having a thin-film transistor comprising:

an insulating layer;

a first semiconductor layer overlying the insulating layer, the first semiconductor layer having an opening therein exposing a portion of the insulating layer;

first and second wall surfaces extending from the exposed portion of the insulating layer to an upper surface of the first semiconductor layer;

a second semiconductor layer overlying the upper surface of the first semiconductor layer, the first and second wall surfaces, and the exposed portion of the insulating layer;

a gate dielectric layer overlying the second semiconductor layer;

a gate electrode positioned in the opening and overlying the gate dielectric layer and defining a channel region in the second semiconductor layer, the channel region overlying the exposed portion of the insulating layer and extending along the first and second wall surfaces from the exposed portion of the insulating layer to the upper surface of the first semiconductor layer;

a thin-film semiconductor layer underlying the insulating layer;

an opening in the insulating layer-exposing a surface portion of the thin-film semiconductor layer; and a drain region in the first semiconductor layer extending into the opening and making a metallurgical contact to the surface portion of the thin-film semiconductor layer.

2. The device of claim 1, wherein the first semiconductor layer contains a conductivity determining dopant having a first concentration and wherein the second semiconductor layer contains a conductivity determining dopant having a second concentration, and wherein the first concentration is greater than the second concentration.

3. The device of claim 1 further comprising insulating sidewall spacers adjacent to the first and second wall surfaces and displacing the second semiconductor layer away from the first and second wall surfaces.

4. A semiconductor device having a thin-film transistor comprising:

an insulating layer;

a first semiconductor layer overlying the insulating layer, the first semiconductor layer having an opening therein exposing a portion of the insulating layer;

a trench in the insulating layer, wherein the trench is continuous with the opening in the first semiconductor layer;

first and second wall surfaces extending from the exposed portion of the insulating layer to an upper surface of the first semiconductor layer;

a second semiconductor layer overlying the upper surface of the first semiconductor layer, the first and second wall surfaces, and the exposed portion of the insulating layer;

a gate dielectric layer overlying the second semiconductor layer; and a gate electrode positioned in the opening and overlying the gate dielectric layer and defining a channel region in the second semiconductor layer, the channel region overlying the exposed portion of the insulating layer and extending along the first and second wall surfaces from the exposed portion of the insulating layer to the upper surface of the first semiconductor layer.

5. A semiconductor device having a thin-film transistor comprising:

a first insulating layer;

a second insulating layer overlying the first insulating layer;

a first semiconductor layer overlying the second insulating layer, the first semiconductor layer and the second insulating layer having an opening therethrough exposing a portion of the first insulating layer, wherein the opening has first and second wall surfaces extending from the exposed portion of the first insulating layer to an upper surface of the first semiconductor layer;

a second semiconductor layer overlying the upper surface of the first semiconductor layer, the first and second wall surfaces, and the exposed portion of the first insulating layer;

a gate dielectric layer overlying the second semiconductor layer; and a gate electrode overlying the gate dielectric layer and defining a channel region in the second semiconductor layer, the channel region extending from the exposed portion of the first insulating layer to the upper surface of the first semiconductor layer.

6. The device of claim 5, wherein the first insulating layer comprises silicon dioxide and the second insulating layer comprises silicon nitride.

7. The device of claim 5 further comprising insulating sidewall spacers adjacent to the first and second wall surfaces and displacing the second semiconductor layer away from the the first and second wall surfaces.

8. A semiconductor device having a thin-film transistor comprising:

a first thin-film layer overlying an insulating layer;

a first section of the first thin-film layer having a first wall surface;

a second section of the first thin-film layer having a second wall surface, wherein the first wall surface is separated from the second wall surface by a void, and wherein the void exposes a portion of the insulating layer;

a second thin-film layer overlying the first and second wall surfaces and the exposed portion of the insulating layer;

a gate dielectric layer overlying the second thin-film layer;

a gate electrode positioned in the void and defining a channel region in the second thin-film layer, the channel region extending along the first and second wall surfaces and overlying the exposed portion of the insulating layer;

a third thin-film layer underlying the insulating layer; and an opening in the insulating layer exposing a surface portion of the third thin-film layer, wherein the drain region extends into the opening and forms a metallurgical contact to the surface portion of the third thin-film layer.

9. The device of claim 8, wherein the first thin-film layer contains a conductivity determining dopant having a first concentration, and wherein the second thin-film layer contains a conductivity determining dopant having a second concentration, and wherein the first concentration is greater than the second concentration.

10. The device of claim 8 further comprising a source region in first section of the first thin-film layer and a drain region in the second section of the first thin-film layer.

11. A semiconductor device having a thin-film transistor comprising:

a driver transistor having a first gate electrode overlying a substrate surface;

an insulating layer overlying the driver transistor, the insulating layer having an opening therein exposing a surface portion of the first gate electrode;

a first thin-film layer overlying the insulating layer;

a first section of the first thin-film layer having a first wall surface;

a second section of the first thin-film layer having a second wall surface, wherein the first wall surface is separated from the second wall surface by a void, and wherein the void exposes a portion of the insulating layer;

a drain region in the second section of the first thin-film layer extending into the opening in the insulating layer and contacting the surface portion of the first gate electrode;

a second thin-film layer overlying the first and second wall surfaces and the exposed portion of the insulating layer;

a gate dielectric layer overlying the second thin-film layer; and a second gate electrode positioned in the void and defining a channel region in the second thin-film layer extending along the first and second wall surfaces and overlying the exposed portion of the insulating layer.

12. The device of claim 11, wherein the first thin-film layer contains a conductivity determining dopant having a first concentration, and wherein the second thin-film layer contains a conductivity determining dopant having a second concentration, and wherein the first concentration is greater than the second concentration.

* * * * *